United States Patent
Dey et al.

(10) Patent No.: US 12,431,880 B2
(45) Date of Patent: Sep. 30, 2025

(54) PHASED ARRAY TRANSCEIVER INCLUDING A BIDIRECTIONAL PHASE SHIFTER

(71) Applicant: Samsung Electronics Co., Ltd, Suwon-si (KR)

(72) Inventors: Samrat Dey, Santa Clara, CA (US); Venumadhav Bhagavatula, Santa Clara, CA (US); Siuchuang Ivan Lu, San Jose, CA (US); Sangwon Son, Palo Alto, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 237 days.

(21) Appl. No.: 18/313,139

(22) Filed: May 5, 2023

(65) Prior Publication Data
US 2024/0235536 A1 Jul. 11, 2024

Related U.S. Application Data

(60) Provisional application No. 63/438,184, filed on Jan. 10, 2023.

(51) Int. Cl.
| | |
|---|---|
| *H03K 5/01* | (2006.01) |
| *H01P 5/00* | (2006.01) |
| *H03K 5/00* | (2006.01) |

(52) U.S. Cl.
CPC ............... *H03K 5/01* (2013.01); *H01P 5/00* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 5,049,841 A | * | 9/1991 | Cooper | H03H 11/245 333/81 R |
| 6,894,657 B2 | | 5/2005 | Carey | |

(Continued)

FOREIGN PATENT DOCUMENTS

| | | | | | |
|---|---|---|---|---|---|
| CN | 107046407 A | * | 8/2017 | ............ | H03F 1/3211 |
| CN | 108011167 B | * | 8/2020 | ................ | H01P 5/10 |

(Continued)

OTHER PUBLICATIONS

H. Nam, V.-V. Nguyen, V.-S. Trinh, J.-M. Song, B.-H. Lee and J.-D. Park, "A Full X-Band Phased-Array Transmit/Receive Module Chip in 65-nm CMOS Technology," in IEEE Access, vol. 8, pp. 76182-76192, 2020. (Year: 2020).*

(Continued)

*Primary Examiner* — Berhanu Tadese
(74) *Attorney, Agent, or Firm* — Lewis Roca Rothgerber Christie LLP

(57) ABSTRACT

A method, a phase shifter, and a user equipment (UE) are disclosed for transmitting and receiving signals in a phased array. The method includes receiving, by a balun of a phase shifter, a transmission single-ended input signal at a single-ended side of the balun and generating a transmission differential input signal at a differential side of the balun, generating, by a differential quadrature coupler of the phase shifter, a transmission in-phase signal and a transmission quadrature signal, based on the transmission differential input signal, and combining, by a differential attenuator of the phase shifter, the transmission in-phase signal and the transmission quadrature signal into a differential phase-shifted output signal.

20 Claims, 5 Drawing Sheets

(56) References Cited

U.S. PATENT DOCUMENTS

| | | | |
|---|---|---|---|
| 6,954,506 B2* | 10/2005 | Cho | G06F 13/4291 |
| | | | 375/321 |
| 7,446,630 B2* | 11/2008 | Chan | H03H 7/18 |
| | | | 333/165 |
| 7,956,704 B1* | 6/2011 | Acimovic | H03H 1/0007 |
| | | | 333/185 |
| 8,789,003 B1* | 7/2014 | Ding | G06F 30/373 |
| | | | 716/136 |
| 9,319,021 B2* | 4/2016 | Ehyaie | H03H 7/185 |
| 9,800,434 B2* | 10/2017 | Ding | H03K 17/687 |
| 9,813,264 B2* | 11/2017 | Ding | H04L 25/0272 |
| 9,923,530 B2* | 3/2018 | Kao | H03H 7/40 |
| 9,960,883 B1* | 5/2018 | Chakraborty | H03D 7/1458 |
| 10,122,341 B2* | 11/2018 | Pye | H01P 5/10 |
| 10,256,865 B2* | 4/2019 | Perumana | H04B 1/56 |
| 10,277,179 B2* | 4/2019 | Kao | H03F 3/45076 |
| 10,476,157 B1* | 11/2019 | Segoria | H03H 7/20 |
| 10,523,167 B2* | 12/2019 | Shimura | H01P 1/22 |
| 10,608,335 B2* | 3/2020 | Valdes Garcia | H04B 1/00 |
| 10,656,496 B2* | 5/2020 | Hashemi | G02F 1/2955 |
| 10,879,978 B2 | 12/2020 | Ho et al. | |
| 10,886,612 B2* | 1/2021 | Ngai | H01Q 3/34 |
| 11,012,113 B2* | 5/2021 | Taghizadeh Ansari | |
| | | | H03H 7/075 |
| 11,063,355 B2* | 7/2021 | Wu | H04B 1/44 |
| 11,290,084 B2* | 3/2022 | Nielsen | H03H 11/1291 |
| 11,316,489 B2* | 4/2022 | Patel | H03K 5/026 |
| 11,349,503 B2* | 5/2022 | Mohammadi | H03F 1/3247 |
| 11,356,084 B2* | 6/2022 | Gorbachov | H03K 5/01 |
| 11,424,539 B2* | 8/2022 | Alpman | H04B 7/0639 |
| 11,569,555 B2* | 1/2023 | Patel | H04B 1/40 |
| 11,581,644 B2* | 2/2023 | Yu | H03H 11/20 |
| 11,736,150 B2* | 8/2023 | Wang | H01P 1/18 |
| | | | 343/702 |
| 11,791,973 B2* | 10/2023 | Hur | H04L 5/1461 |
| | | | 370/282 |
| 11,862,862 B2* | 1/2024 | Motoi | H01Q 25/02 |
| 11,955,732 B2* | 4/2024 | Alpman | H05K 1/0218 |
| 12,062,859 B2* | 8/2024 | Malekzadeh | H01Q 3/36 |
| 12,166,289 B2* | 12/2024 | Kraut | H03H 7/20 |
| 12,166,473 B2* | 12/2024 | Nielsen | H03H 9/542 |
| 2008/0180190 A1* | 7/2008 | Chan | H03H 7/48 |
| | | | 333/118 |
| 2014/0152399 A1* | 6/2014 | Ehyaie | H03H 7/185 |
| | | | 333/139 |
| 2014/0269449 A1* | 9/2014 | Abramsky | H04L 5/14 |
| | | | 370/278 |
| 2018/0131338 A1* | 5/2018 | Shimura | H03H 11/245 |
| 2019/0172635 A1 | 6/2019 | Ku et al. | |
| 2020/0350679 A1 | 11/2020 | Yu et al. | |
| 2021/0175589 A1 | 6/2021 | Patel et al. | |
| 2021/0344124 A1 | 11/2021 | Motoi | |
| 2021/0376466 A1* | 12/2021 | Kraut | H03H 7/21 |
| 2022/0094514 A1 | 3/2022 | Hur et al. | |
| 2022/0123703 A1* | 4/2022 | Hoogzaad | H03G 1/0023 |
| 2022/0384956 A1* | 12/2022 | Alpman | H01Q 1/38 |
| 2022/0399642 A1* | 12/2022 | Ghadiri Sadrabadi | H01Q 3/34 |
| 2023/0011044 A1* | 1/2023 | Hur | H04L 27/22 |
| 2023/0031668 A1* | 2/2023 | Aoki | H01Q 3/267 |
| 2023/0095788 A1* | 3/2023 | Wang | H01Q 3/36 |
| | | | 343/702 |
| 2023/0170871 A1* | 6/2023 | Yang | H03F 1/22 |
| | | | 330/291 |
| 2024/0072402 A1* | 2/2024 | Dinc | H03H 11/20 |
| 2024/0235536 A1* | 7/2024 | Dey | H03K 5/01 |
| 2024/0405424 A1* | 12/2024 | Wu | H03F 3/245 |

FOREIGN PATENT DOCUMENTS

| | | | | |
|---|---|---|---|---|
| CN | 107046407 B | * | 2/2021 | H03F 1/3211 |
| CN | 112994733 A | * | 6/2021 | |
| CN | 112994733 B | * | 8/2021 | |
| CN | 114303316 A | * | 4/2022 | H01Q 21/0025 |
| CN | 114389570 A | * | 4/2022 | H03F 3/19 |
| CN | 114641929 A | * | 6/2022 | H01P 1/18 |
| CN | 115664566 A | * | 1/2023 | |
| CN | 116208110 A | * | 6/2023 | H03F 1/22 |
| CN | 118337233 A | * | 7/2024 | H01P 5/00 |
| CN | 115664566 B | * | 10/2024 | |
| DE | 102020206800 A1 | * | 12/2021 | G01S 13/02 |
| DE | 102020206800 B4 | * | 12/2022 | G01S 13/02 |
| EP | 3174198 A1 | * | 5/2017 | H03F 1/3211 |
| EP | 3324540 B1 | * | 7/2019 | H01Q 3/28 |
| EP | 3985868 A1 | * | 4/2022 | H03F 3/19 |
| EP | 4071932 A1 | * | 10/2022 | H01Q 3/267 |
| EP | 3174198 B1 | * | 5/2023 | H03F 1/3211 |
| EP | 4187786 A1 | * | 5/2023 | H03F 1/22 |
| EP | 3584943 B1 | * | 7/2024 | H01Q 1/2283 |
| ES | 2744918 T3 | * | 2/2020 | H01Q 3/28 |
| GB | 2436471 A | | 9/2007 | |
| JP | 2005223912 A | * | 8/2005 | H03H 11/265 |
| JP | 2018078391 A | * | 5/2018 | G01R 31/31926 |
| JP | 6809147 B2 | * | 1/2021 | G01R 31/31926 |
| JP | 7265486 B2 | * | 4/2023 | H03H 11/12 |
| RU | 2657336 C1 | | 6/2018 | |
| RU | 2766853 C1 | | 3/2022 | |
| TW | 202207620 A | * | 2/2022 | H03K 5/01 |
| TW | 202247602 A | * | 12/2022 | H03H 11/12 |
| WO | WO-2014085640 A1 | * | 6/2014 | H03H 7/185 |
| WO | WO-2019108190 A1 | * | 6/2014 | |
| WO | WO-2021041766 A2 | * | 3/2021 | H01Q 21/0025 |
| WO | WO-2021141434 A1 | * | 7/2021 | H01Q 3/267 |
| WO | WO-2022031734 A1 | * | 2/2022 | H03K 5/01 |
| WO | WO-2023049623 A1 | * | 3/2023 | H01P 1/18 |
| WO | WO-2023159651 A1 | * | 8/2023 | |

OTHER PUBLICATIONS

Tian et al. A 26-32GHz 6-bit Bidirectional Passive Phase Shifter with 14dBm IP1dB and 2.6○ RMS Phase Error for Phased Array System in 40nm CMOS, IEEE 2023 (Year: 2023).*
Pi-pad Attenuator—Tutorial for Passive Attenuators. by Basic Electronics ( Retrieved on Feb. 17, 2025 from https://www.electronics-tutorials.ws/attenuators/pi-pad-attenuator.html ).*
Dunworth, J.D., et al., "A 28GHz Bulk-CMOS dual-polarization phased-array transceiver with 24 channels for 5G user and basestation equipment," 2018 IEEE International Solid—State Circuits Conference—(ISSCC), 2018, pp. 70-72.
Hameau, F., et al., "A highly linear bidirectional phase shifter based on vector modulator for 60GHz applications," 2017 IEEE MTT-S International Microwave Symposium (IMS), 2017.
Pang, J., et al., "A 28-GHz CMOS Phased-Array Beamformer Utilizing Neutralized Bi-Directional Technique Supporting Dual-Polarized MIMO for 5G NR," in IEEE Journal of Solid-State Circuits, vol. 55, No. 9, pp. 2371-2386, Sep. 2020.
Shakib, S., et al., "A Wideband 28-GHz Transmit-Receive Front-End for 5G Handset Phased Arrays in 40-nm CMOS," in IEEE Transactions on Microwave Theory and Techniques, vol. 67, No. 7, pp. 2946-2963, Jul. 2019.

* cited by examiner

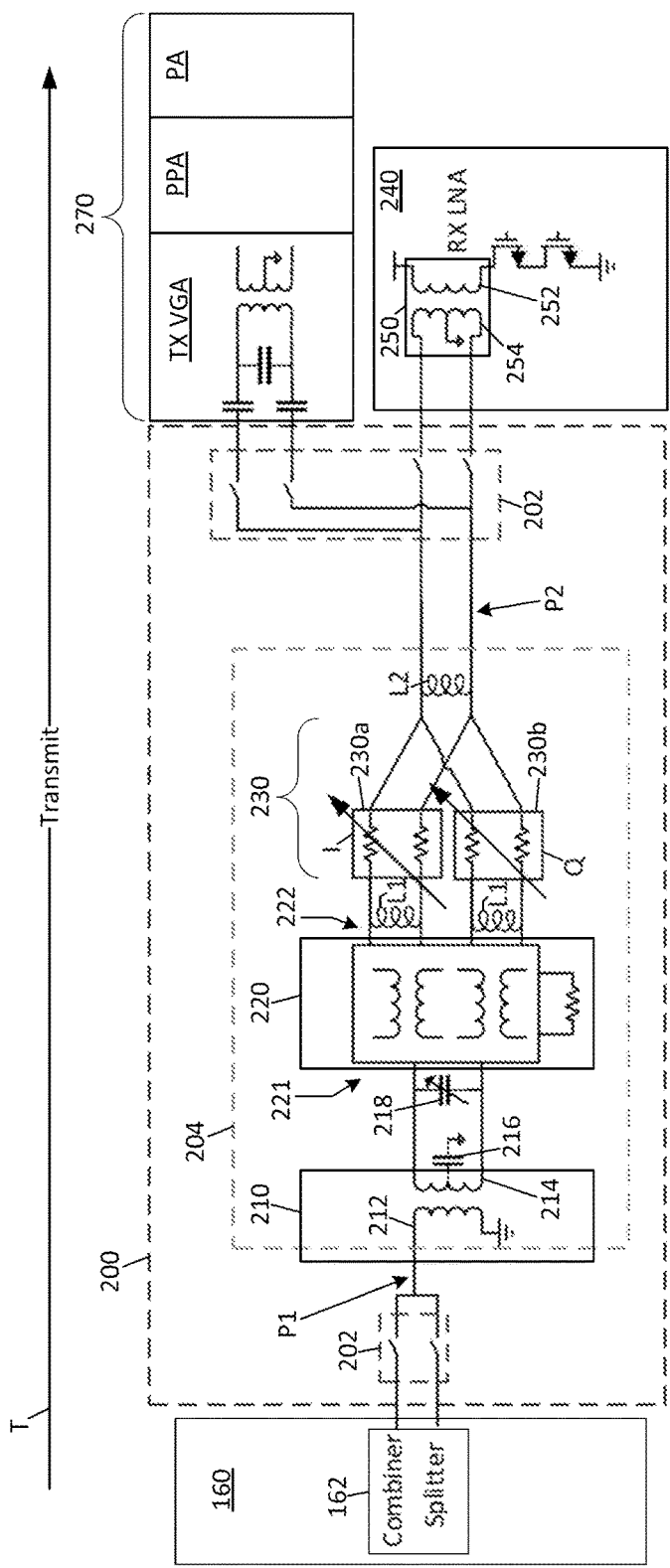
FIG. 5A
FIG. 5B
FIG. 5C
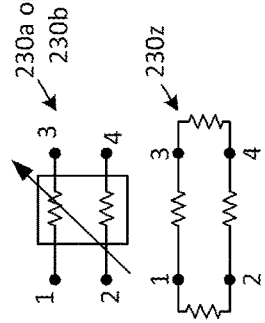
FIG. 5D
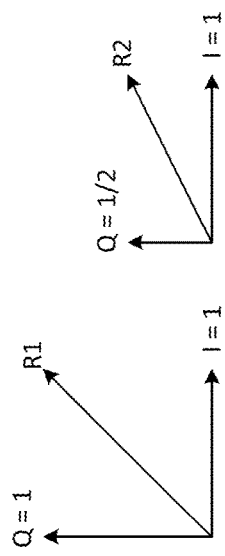
FIG. 5E
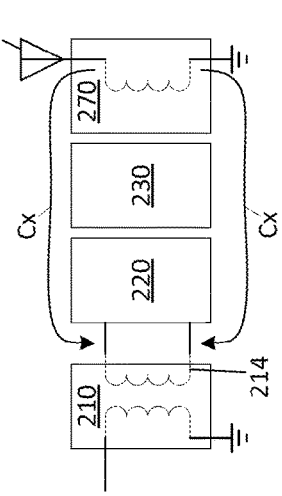

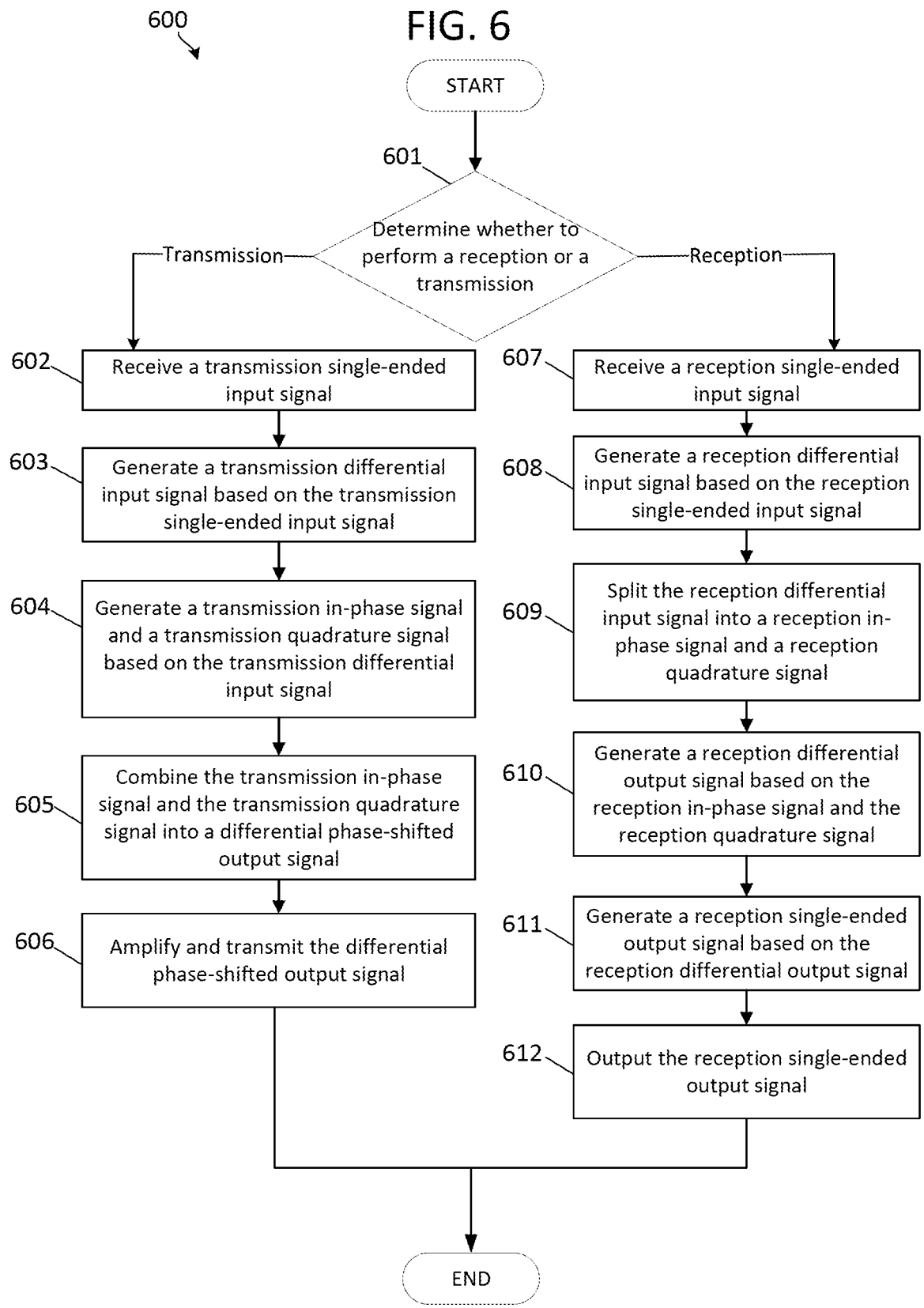

PHASED ARRAY TRANSCEIVER INCLUDING A BIDIRECTIONAL PHASE SHIFTER

CROSS-REFERENCE TO RELATED APPLICATION

This application claims priority to and the benefit of U.S. Provisional Application No. 63/438,184, filed on Jan. 10, 2023, entitled "TECHNIQUE TO LOWER POWER AND AREA IN PHASED ARRAY TRANSCEIVER (TRX) FRONT END USING A BIDIRECTIONAL PHASE SHIFTER" the entire disclosure of which is incorporated by reference herein.

BACKGROUND

1. Field

Aspects of embodiments of the present disclosure relate to wireless communications. More particularly, aspects of embodiments of the present disclosure relate to improved phased-array systems.

2. Description of the Related Art

Modern communications systems (e.g., mobile phones, vehicles, satellites, and the like) may use relatively higher frequencies for receiving and transmitting signals. Some communications systems may receive and transmit signals using omni-directional antennas. Omni-directional antennas may waste power at transmission paths located away from a corresponding receiver. Such wasted power may become increasingly problematic at higher frequencies.

The above information disclosed in this Background section is for enhancement of understanding of the background of the present disclosure, and therefore, it may contain information that does not constitute prior art.

SUMMARY

To use power more efficiently at higher frequencies, some communications systems are configured with phased-array systems. For example, communications systems may include integrated phased-array systems targeted for use with fifth generation (5G) millimeter (mm) wave (5G mm-wave) communication. To enable the use of 5G mm-wave communications in a user equipment (UE), the UE may be configured to meet stringent specifications for transmitter (TX) effective isotropic radiated power (EIRP) and receiver (RX) sensitivity. Such UEs may be configured for improved TX power output and RX signal-to-noise ratio (SNR) by incorporating a low-power and low-area transceiver (TRX) front-end (FE) architecture. Such an architecture may result in a UE having a relatively bigger array in a limited space, which may cause instabilities in the UE due to ground coupling between stages of the transceiver FE.

One or more embodiments of the present disclosure are directed to systems and methods including a passive phase-shifter architecture that may be shared across the TX and RX chains in communications systems (e.g., in the FE architecture of a UE) to enable low-power and low-area phased-array systems with improved stability.

A phase shifter is one building block in phased-array systems. The phase shifter enables electronically steerable beamforming. In some radio-frequency (RF) phase shifters, where the phase shifter is part of a FE array element, each TX and RX chain may have its own phase shifters. Contrastingly, according to one or more embodiments of the present disclosure, in a bidirectional phase-shifter implementation, the phase shifter may be shared across the TX and RX paths to reduce the size of the array element. Additionally, when designed using passive circuit blocks, phase shifters may have a reduced current consumption (e.g., zero current consumption). Reducing current consumption by a phase shifter may result in a current savings per array element. The current savings may be utilized elsewhere in an integrated phased-array system.

Some embodiments of the present disclosure are directed to a phased array including a balun having a single-ended input and a differential output connected to a transmission-input side of a differential quadrature coupler. A transmission-output side of the differential quadrature coupler may be connected to a differential passive attenuator. The balun, the differential quadrature coupler, and the differential passive attenuator may be shared across the TX and RX chains.

The above approaches improve on previous methods because: (i) sharing components of the phase shifter across the TX and RX chains reduces the size of the array; (ii) using passive components in the phase shifter reduces current consumption; and (iii) using a balun with a single-ended input and a differential output for transmission allows for improved stability through common-mode rejection (CMR).

According to some embodiments of the present disclosure, a method of transmitting and receiving signals in a phased array includes receiving, by a balun of a phase shifter, a transmission single-ended input signal at a single-ended side of the balun and generating a transmission differential input signal at a differential side of the balun, generating, by a differential quadrature coupler of the phase shifter, a transmission in-phase signal and a transmission quadrature signal, based on the transmission differential input signal, and combining, by a differential attenuator of the phase shifter, the transmission in-phase signal and the transmission quadrature signal into a differential phase-shifted output signal.

The phase shifter may be shared between transmission and reception paths.

The method may further include causing, by a processor communicably coupled to the phase shifter, a switch of the phase shifter to be configured for a transmission, and providing the differential phase-shifted output signal to a transmitting amplifier to be transmitted.

The method may further include causing, by a processor communicably coupled to the phase shifter, a switch to be configured for a reception, splitting, by the differential attenuator, a reception differential input signal into a reception in-phase signal and a reception quadrature signal, generating, by the differential quadrature coupler, a reception differential output signal, based on the reception in-phase signal and the reception quadrature signal, and generating, by the balun, a reception single-ended output signal at the single-ended side of the balun, based on the reception differential output signal being input to the differential side of the balun.

The balun may be connected to a transmission-input side of the differential quadrature coupler, and the differential attenuator may be connected to a transmission-output side of the differential quadrature coupler.

The differential attenuator may be configured to be digitally controlled, and the phase shifter may be configured to generate a 360-degree phase range in steps of 22.5 degrees.

The differential quadrature coupler may be a 90-degree hybrid coupler, and the differential attenuator may include a pi implementation.

A first phase-shifter interface corresponding to a transmission-input side of the differential quadrature coupler may have a single-ended impedance that is equal to a first value, and a second phase-shifter interface corresponding to a transmission-output side of the differential quadrature coupler may have a differential impedance that is substantially equal to the first value.

According to other embodiments of the present disclosure, a phase shifter for transmitting and receiving signals in a phased array includes a balun, a differential quadrature coupler, and a differential attenuator, wherein the phase shifter is configured to receive a transmission single-ended input signal at a single-ended side of the balun and generate a transmission differential input signal at a differential side of the balun, generate, by the differential quadrature coupler, a transmission in-phase signal and a transmission quadrature signal, based on the transmission differential input signal, and combine, by the differential attenuator, the transmission in-phase signal and the transmission quadrature signal into a differential phase-shifted output signal.

The phase shifter may be shared between transmission and reception paths.

The phase shifter may be configured to transmit based on a processor communicably coupled to the phase shifter causing a switch of the phase shifter to be configured for a transmission, and provide the differential phase-shifted output signal to a transmitting amplifier to be transmitted.

The phase may be configured to transmit based on a processor communicably coupled to the phase shifter causing a switch of the phase shifter to be configured for a reception, split, by the differential attenuator, a reception differential input signal into a reception in-phase signal and a reception quadrature signal, generate, by the differential quadrature coupler, a reception differential output signal, based on the reception in-phase signal and the reception quadrature signal, and generate, by the balun, a reception single-ended output signal at the single-ended side of the balun, based on the reception differential output signal being input to the differential side of the balun.

The balun may be connected to a transmission-input side of the differential quadrature coupler, and the differential attenuator may be connected to a transmission-output side of the differential quadrature coupler.

The differential attenuator may be configured to be digitally controlled, and the phase shifter may be configured to generate a 360-degree phase range in steps of 22.5 degrees.

The differential quadrature coupler may be a 90-degree hybrid coupler, and the differential attenuator may include a pi implementation.

A first phase-shifter interface corresponding to a transmission-input side of the differential quadrature coupler may have a single-ended impedance that is equal to a first value, and a second phase-shifter interface corresponding to a transmission-output side of the differential quadrature coupler may have a differential impedance that is substantially equal to the first value.

According to other embodiments of the present disclosure, a UE for transmitting and receiving signals in a phased array includes a phase shifter, wherein the phase shifter is configured to receive a transmission single-ended input signal at a single-ended side of a balun and generate a transmission differential input signal at a differential side of the balun, generate, by a differential quadrature coupler, a transmission in-phase signal and a transmission quadrature signal, based on the transmission differential input signal, and combine, by a differential attenuator, the transmission in-phase signal and the transmission quadrature signal into a differential phase-shifted output signal.

The phase shifter may be shared between transmission and reception paths.

The phase shifter may be configured to transmit based on a processor communicably coupled to the phase shifter causing a switch of the phase shifter to be configured for a transmission, and provide the differential phase-shifted output signal to a transmitting amplifier to be transmitted.

The phase shifter may be configured to transmit based on a processor communicably coupled to the phase shifter causing a switch of the phase shifter to be configured for a reception, split, by the differential attenuator, a reception differential input signal into a reception in-phase signal and a reception quadrature signal, generate, by the differential quadrature coupler, a reception differential output signal, based on the reception in-phase signal and the reception quadrature signal, and generate, by the balun, a reception single-ended output signal at the single-ended side of the balun, based on the reception differential output signal being input to the differential side of the balun.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 5A is a schematic circuit diagram depicting components of a phase shifter of the UE depicted in FIG. 4, according to some embodiments of the present disclosure;

FIG. 5B and FIG. 5C are diagrams depicting phase shifting and amplitude scaling by a differential quadrature coupler and a differential passive attenuator of the phase shifter depicted in FIG. 5A, according to some embodiments of the present disclosure;

FIG. 5D is a schematic diagram depicting a pi implementation associated with an attenuator in the phase shifter depicted in FIG. 5A, according to some embodiments of the present disclosure;

FIG. 5E is a schematic diagram depicting coupling between two stages of a transceiver, including the phase shifter depicted in FIG. 5A, according to some embodiments of the present disclosure;

FIG. 6 is a flowchart depicting a method of transmitting and receiving signals using a phased array, according to some embodiments of the present disclosure.

DETAILED DESCRIPTION

Figure 1:
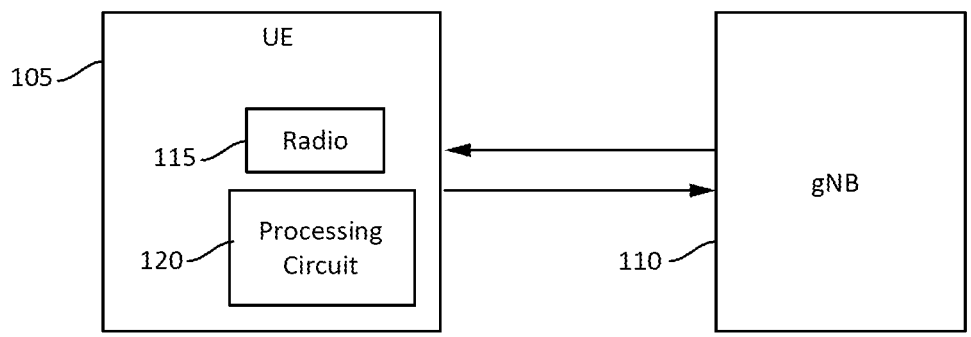
FIG. 1 is a block diagram depicting a system including a UE and a network node, according to some embodiments of the present disclosure.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

FIG. 1 is a block diagram depicting a system including a user equipment (UE) 105 and a network node 110 (e.g., a gNodeB), according to some embodiments of the present disclosure. As illustrated in FIG. 1, the UE 105 and the network node 110 are communicably connected to each other.

Referring to FIG. 1, the UE 105 may include a radio 115 and a processing circuit 120 (or a means for processing), which may perform various methods described herein. For example, the processing circuit 120 may receive, via the radio 115, transmissions from the network node 110, and the processing circuit 120 may transmit, via the radio 115, signals to the network node 110. The radio 115 may include a transceiver 150 (e.g., see FIG. 4). In one or more embodiments of the present disclosure, the processing circuit 120 may determine whether to perform a reception or a transmission based on information received from the network node 110. The processing circuit 120 may cause the UE 105 to be configured for a transmission mode or a reception mode based on the determination.

Figure 7:
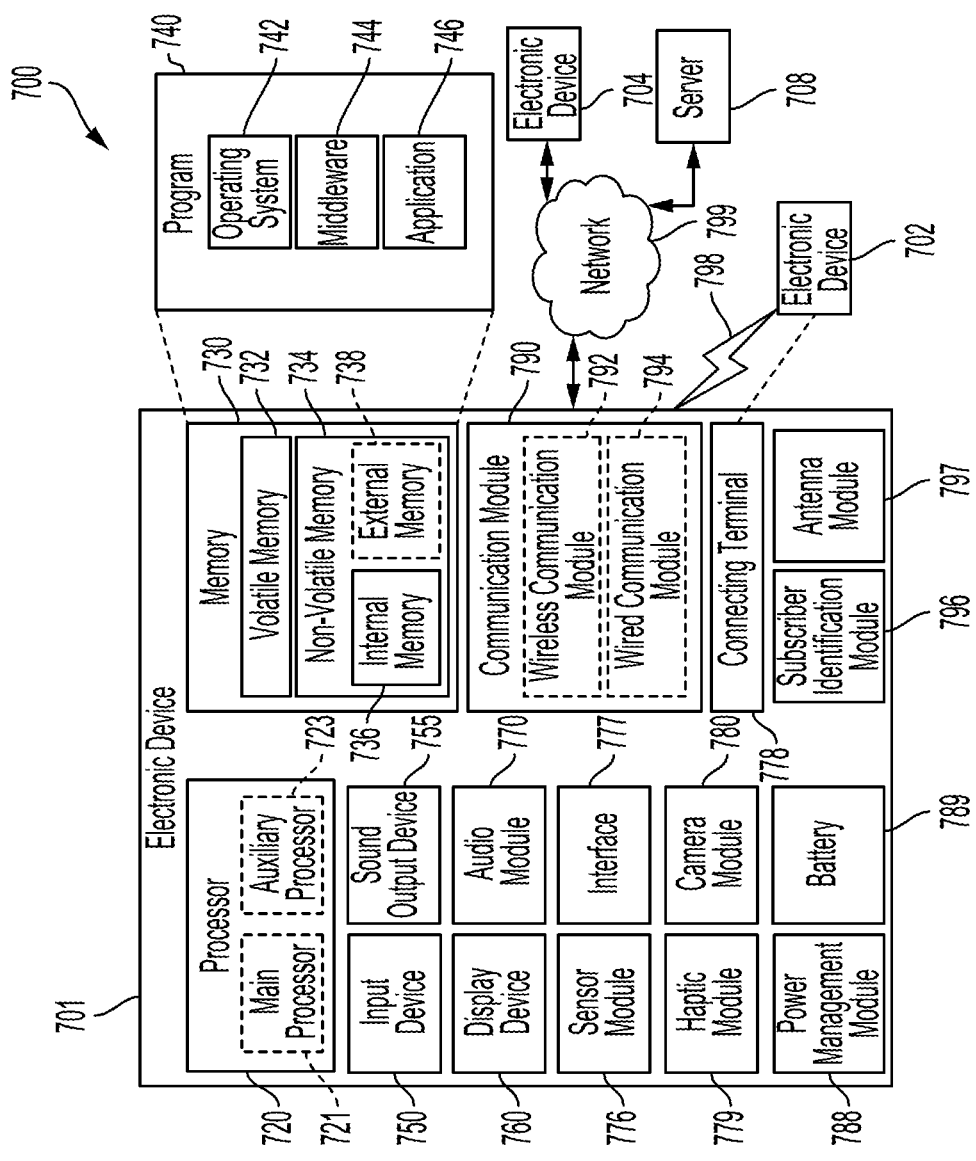
FIG. 7 is a block diagram of an electronic device in a network environment, according to some embodiments of the present disclosure.

The UE 105 may correspond to the electronic device 701 (e.g., see FIG. 7). The UE 105 may be a communications device (e.g., a mobile phone, a satellite, a tablet, a personal computer, a navigation device, a game console, and the like). In some embodiments of the present disclosure, the network node 110 may be included in a first network 798 (e.g., see FIG. 7). In some embodiments of the present disclosure, the network node 110 may be included in a second network 799 (e.g., see FIG. 7). The radio 115 may correspond to a wireless communication module 792 (e.g., see FIG. 7). The radio 115 may include an antenna module 797 (e.g., see FIG. 7). The processing circuit 120 may correspond to a processor 720 (e.g., see FIG. 7).

For example, in some embodiments, the processing circuit 120 may include one or more processors and memory. Each of the processors may be a general purpose processor or specific purpose processor, an application specific integrated circuit (ASIC), one or more field programmable gate arrays (FPGAs), a group of processing components, or other suitable processing components. Each of the processors may be integrated within a single device or distributed across multiple separate systems, servers, or devices (e.g., computers). For example, each of the processors may be an internal processor with respect to the UE 105, or one or more of the processors may be an external processor, for example, implemented as part of one or more servers or as a cloud-based computing system. Each of the processors may be configured to execute computer code or instructions stored in the memory, and/or received from other computer readable media (e.g., CDROM, network storage, a remote server, and/or the like).

The memory may include one or more devices (e.g., memory units, memory devices, storage devices, and/or the like) for storing data and/or computer code for performing and/or facilitating the various processes described in the present disclosure. The memory may include random access memory (RAM), read-only memory (ROM), hard drive storage, temporary storage, non-volatile memory, flash memory, optical memory, or any other suitable memory for storing software objects and/or computer instructions. The memory may include database components, object code components, script components, and/or any other kinds of information structures for supporting the various activities and information structures described in the present disclosure. The memory may be communicably connected to the one or more processors via the processing circuit 120, and may include computer code for executing (e.g., by the one or more processors or processing circuits) one or more processes described herein.

Figure 2:
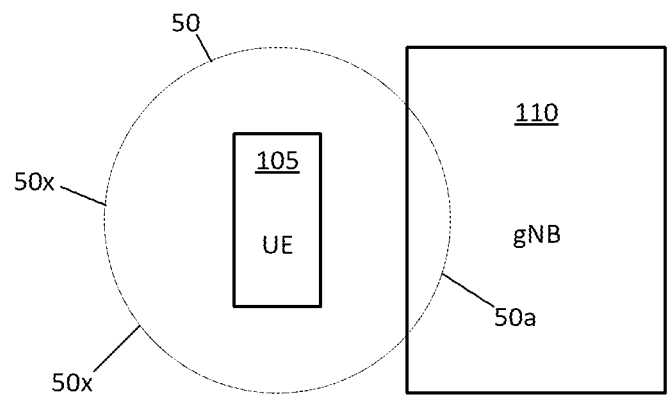
FIG. 2 is a diagram depicting a transmission from an omni-directional antenna.

FIG. 2 is a diagram depicting a transmission from an omni-directional antenna.

Referring to FIG. 2, as discussed above, some communications systems may be configured to receive and transmit signals using omni-directional antennas. For example, a UE 105 may be configured with an omni-directional antenna for transmitting at relatively lower frequencies. The UE 105 may generate omni-directional radiation 50 via the omni-directional antenna. A portion of the omni-directional radiation 50 may be received by the network node 110 and may, thus, correspond to utilized power 50a. A portion of the omni-directional radiation 50 may be directed away from, and not received by, the network node 110 and may, thus, correspond to wasted power 50x. The wasted power 50x associated with the omni-directional radiation 50 may be problematic at relatively higher frequencies. For example, the UE 105 may be configured to transmit at 2 gigahertz (GHz) for fourth generation (4G) wireless communications and may be configured to transmit at 40 GHZ, within a mm-wave band, for 5G wireless communications. The wasted power 50x may be acceptable at 2 GHz because it may be easier to generate power at 2 GHz than to generate power at 40 GHz. Accordingly, in some embodiments, the UE 105 may be configured with a phased array 170 (e.g., see FIG. 4) to transmit radio waves in a beam 60 (e.g., see FIGS. 3A and 3B).

Figure 3A:
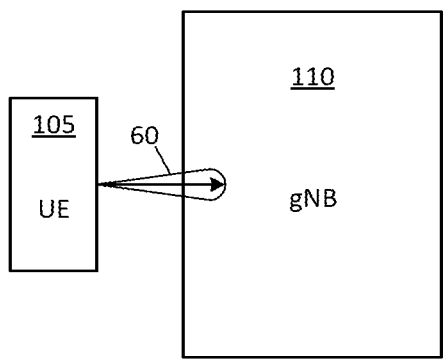
FIG. 3A and FIG. 3B are diagrams depicting beam steering with a UE in two different locations, according to some embodiments of the present disclosure.
Figure 3B:
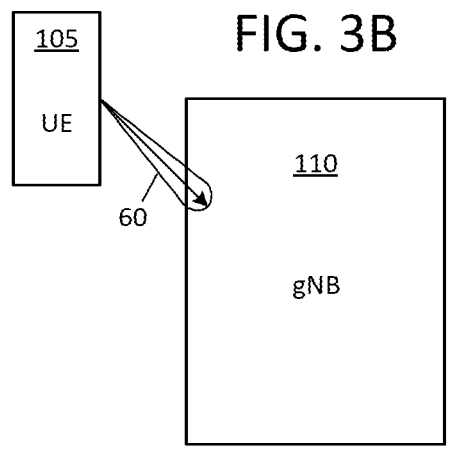

FIG. 3A and FIG. 3B are diagrams depicting beam steering with a UE in two different locations, according to some embodiments of the present disclosure.

Referring to FIGS. 3A and 3B, the UE 105 may be configured with a phased array 170 (e.g., see FIG. 4) to transmit radio waves in a beam 60 to reduce an amount of wasted power 50x. When transmitting in a beam 60, the UE 105 may be configured to steer the beam 60 when it changes locations with respect to the network node 110. To enable beam steering, the UE 105 may include a phase shifter 200 (e.g., see FIG. 4).

Figure 4:
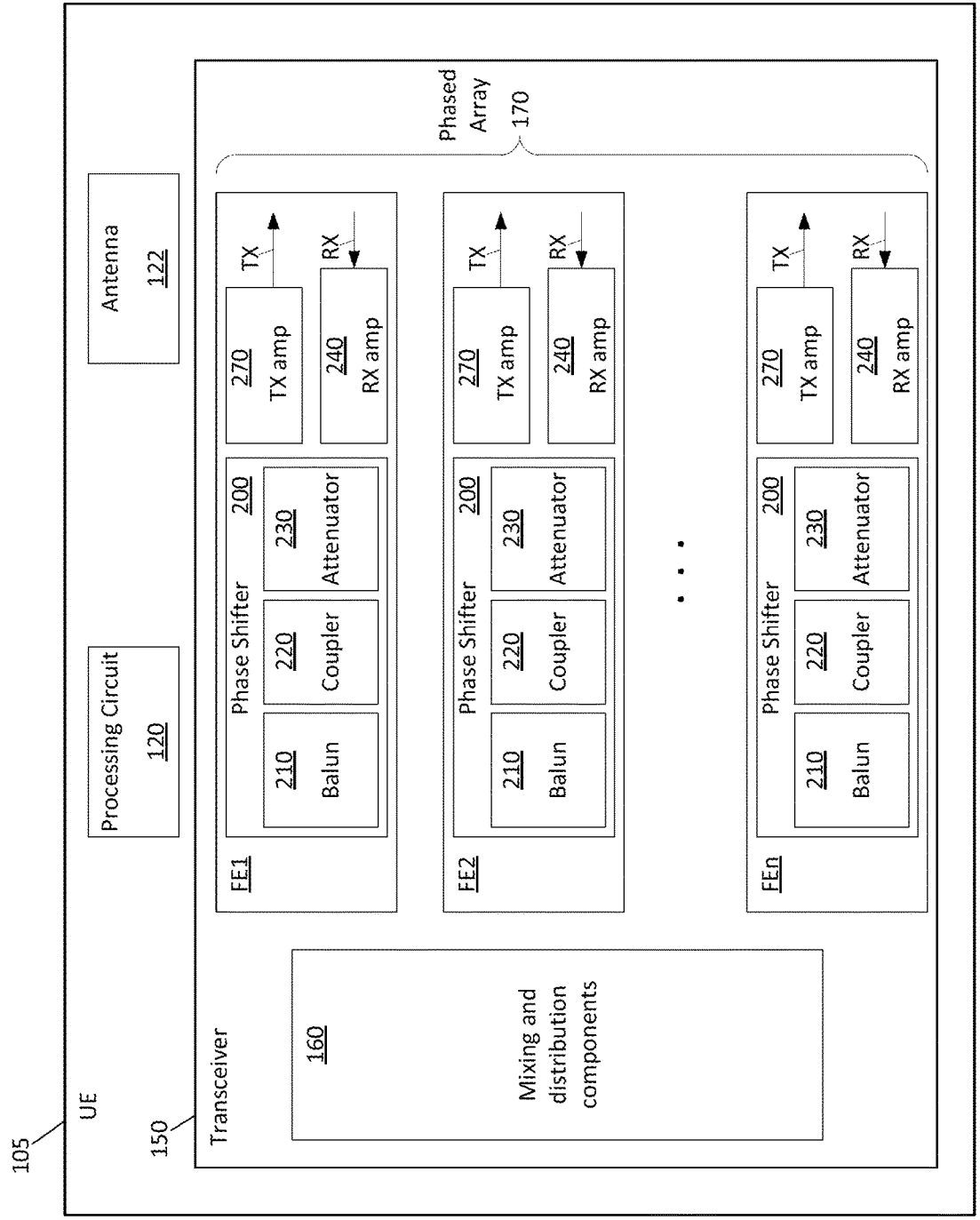
FIG. 4 is a block diagram depicting components of a UE, according to some embodiments of the present disclosure.

FIG. 4 is a block diagram depicting components of a UE, according to some embodiments of the present disclosure.

Referring to FIG. 4, the UE 105 may include one or more antennas 122 and a transceiver 150. The antennas 122 may correspond to the antenna module 797 (e.g., see FIG. 7). The transceiver may include the phased array 170. The phased array 170 may include one or more transceiver front ends (FEs), for example, such as a first transceiver front end FE1 to an n-th transceiver front end FEn, where n is a positive integer. In some embodiments, the UE may include 32 or more transceiver FEs. The transceiver FEs may be coupled to mixing and distribution components at one end thereof. The transceiver FEs may be coupled to the antennas 122 at another end thereof.

Compact transceiver-FE architectures may enable bigger arrays in a limited space, thereby, allowing for higher EIRP in transmissions and improved signal-to-noise ratio in receptions. Bidirectional architectures enable low area FEs by sharing circuit blocks between TX and RX chains. Each transceiver FE in the phased array 170 may include a phase shifter 200. The phase shifter 200 may provide a 360-degree phase range with a desired resolution (e.g., a certain or predetermined resolution). For example, the phase shifter 200 may be configured to provide the 360-degree phase range in steps of 22.5 degrees. UE applications may utilize RF phase shifting, because it may result in a maximum or increased amount of component sharing in a phased system.

Some RF phase-shifting systems include separate phase shifters for the TX and RX paths. Contrastingly, according to one or more embodiments of the present disclosure, with a bidirectional phase shifter and a switch network, the number of phase shifters may be reduced (e.g., by half), and thus, the area where the phase shifters are disposed may be reduced. In some embodiments of the present disclosure, the phase shifter 200 may be a passive RF path phase shifter. The phase shifter 200 may be shared between TX and RX chains to reduce the size of the area consumed by each transceiver FE. For example, the phase shifter 200 may be part of the transceiver 150. In some embodiments, the transceiver 150 may be a 28/39 GHz phased-array transceiver. In some embodiments, the transceiver 150 may have two paths per channel: a transmission path T and a reception path R (e.g., see FIG. 5A).

As illustrated in FIG. 5A and as described in more detail below, each channel may include a switch 202 (e.g., a switch matrix), a receiving amplifier 240 (e.g., a single-ended receiving amplifier) including a low noise amplifier (LNA) for receptions, a transmitting amplifier 270 (e.g., a differential transmitting amplifier) including a power amplifier (PA) for transmissions, and the phase shifter 200. Both the transmission path T and the reception path R may share the same circuit topology with each other for the phase shifter 200. The phase shifter 200 may include a transmission-input balun 210 (the "balun"), a coupler 220, and an attenuator 230.

FIG. 5A is a schematic circuit diagram depicting components of a phase shifter of the UE depicted in FIG. 4, according to some embodiments of the present disclosure.

FIG. 5B and FIG. 5C are diagrams depicting phase shifting and amplitude scaling by a differential quadrature coupler and a differential passive attenuator of the phase shifter depicted in FIG. 5A, according to some embodiments of the present disclosure.

FIG. 5D is a schematic diagram depicting a pi implementation associated with an attenuator in the phase shifter depicted in FIG. 5A, according to some embodiments of the present disclosure.

Referring to FIG. 5A, the phase shifter 200 may be a passive phase shifter that may be shared between the TX and RX chains. The transmission path T may include the mixing and distribution components 160, the phase shifter 200, and the transmitting amplifier 270. The reception path R may include the receiving amplifier 240, the phase shifter 200, and the mixing and distribution components 160. The mixing and distribution components 160 may include a combiner-splitter network 162 (e.g., a transmission line-based combining/splitting network). The combiner-splitter network 162 may interface with one or more up/down conversion mixers respectively corresponding to the TX chains and the RX chains of each transceiver FE (e.g., see FIG. 4).

The phase shifter 200 may be configured to generate a 360-degree phase range in steps of 22.5 degrees (e.g., in a 4-bit resolution). The phase shifter 200 may include a first phase-shifter interface P1 and a second phase-shifter interface P2. The first phase-shifter interface P1 may be connected to the combiner-splitter network 162. The second phase- shifter interface P2 may be connected to the transmitting amplifier 270 and with the receiving amplifier 240 via a switch 202 (e.g., a switching circuit). In other words, the first phase-shifter interface P1 may be located at a transmission-input side (i.e., a reception-output side) of a phase shifter core 204. The second phase-shifter interface P2 may be located at a transmission-output side (i.e., a reception-input side) of the phase shifter core 204.

The transmitting amplifier 270 may include components for amplifying and transmitting signals. For example, the transmitting amplifier 270 may include a transmission chain variable-gain amplifier (TX VGA), a pre-power amplifier (PPA), and a power amplifier (PA) for the TX chain. The transmitting amplifier 270 may amplify and transmit a differential phase-shifted output signal from the second phase-shifter interface P2. As discussed in further detail below, the phase shifter 200 may generate the differential phase-shifted output signal in a transmission mode.

The receiving amplifier 240 may include components for amplifying received signals. For example, the receiving amplifier 240 may include a low noise amplifier (LNA) in the RX chain (RX LNA) and a reception-input balun 250. The RX LNA and the reception-input balun 250 may generate a reception differential input signal at a differential side 254 of the reception-input balun 250, based on a reception single-ended input signal being input to a single-ended side 252 of the reception-input balun 250. The reception-input balun 250 may provide the reception differential input signal to the second phase-shifter interface P2 in a reception mode. As discussed in further detail below, the phase shifter 200 may process the reception differential input signal in the reception mode.

The switch 202, which may be located at both interfaces (the first phase-shifter interface P1 and the second phase-shifter interface P2), may operate the phase shifter 200 according to either the transmission mode or the reception mode. For example, the processing circuit 120 (e.g., see FIG. 4) may determine whether to perform a transmission or a reception. Based on the determination, the switch 202 may connect the components of the phase shifter core 204 to the transmission path T for the transmission mode or to the reception path R for the reception mode.

In some embodiments of the present disclosure, the phase-shifter 200 may include (e.g., may be) a vector-modulator based phase shifter. Integrated passive phase shifters may be categorized into three categories: switched-transmission line phase shifters (STPS), reflection-type phase shifters (RTPS), and vector-modulator based phase shifters. STPS and RTPS phase shifters rely on passive component values to generate a phase shift. Thus, a phase range and a phase error for STPS and RTPS phase shifters may vary with process corners (e.g., variations in fabrication parameters). Contrastingly, a vector-modulator based phase shifter may generate the phase shift as a function of a ratio of resistor values in an attenuator. Thus, vector-modulator based phase shifters may be less sensitive to process corner variations than STPS or RTPS.

As discussed above, the phase shifter 200 may include the balun 210, the coupler 220, and the attenuator 230. The balun 210, the coupler 220, and the attenuator 230 may be included in the phase shifter core 204. The following paragraphs discuss signal processing corresponding to the transmission path T followed by signal processing corresponding to the reception path R.

The balun 210 may include a single-ended side 212 and a differential side 214. With respect to the transmission path T, in the transmission mode, the balun 210 may generate a transmission differential input signal at the differential side 214 of the balun 210, based on a transmission single-ended input signal being input to the single-ended side 212 of the balun 210. The single-ended side 212 of the balun 210 may be connected to the first phase-shifter interface P1 at the transmission-input side of the phase shifter core 204. The differential side 214 of the balun 210 may be connected to a transmission-input side 221 of the coupler 220.

The coupler 220 may be a hybrid coupler (e.g., a 90-degree hybrid coupler). The coupler 220 may be a differential quadrature coupler (e.g., a differential quadrature hybrid coupler). A "differential quadrature coupler" as used herein refers to a transceiver component that is used to generate differential in-phase signals I (also referred to as "in-phase signals I") and differential quadrature signals Q (also referred to as "quadrature signals Q"), based on a differential input signal. In the transmission mode, the coupler 220 may generate a transmission in-phase signal I that is in phase with the transmission differential input signal from the balun 210 and may generate a transmission quadrature signal Q that is phase shifted (e.g., time delayed) by 90 degrees with respect to the transmission differential input signal from the balun 210 and with respect to the transmission in-phase signal I.

Referring to FIG. 5B, in the transmission mode, the coupler 220 may generate the transmission in-phase signal I and the transmission quadrature signal Q, which are two 90-degree components (also referred to as "quadrature components") of the transmission differential input signal. Adding (or combining) the transmission in-phase signal I and the transmission quadrature signal Q may provide a phase-shifted resultant. For example, combining the transmission in-phase signal I and the transmission quadrature signal Q having the same amplitude may provide a phase-shifted version of the transmission differential input signal, having a 45-degree phase rotation, as shown by a first resultant R1 depicted in FIG. 5B. A transmission-output side 222 of the coupler 220 may be connected to the attenuator 230.

Referring to FIG. 5C, the attenuator 230 may be a differential passive attenuator. A "differential passive attenuator" as used herein refers to an attenuator capable of providing amplitude scaling of a differential input signal, without the use of a power supply. In the transmission mode, the attenuator 230 may provide amplitude scaling for the transmission in-phase signal I and/or the transmission quadrature signal Q received as inputs to the attenuator 230. The attenuator 230 may provide additional phase shifting by amplitude scaling and combining the transmission in-phase signal I and/or the transmission quadrature signal Q. For example, the attenuator 230 may be configured to reduce the amplitude of the transmission quadrature signal Q by a factor of two while not reducing the amplitude of the transmission in-phase signal I. As a result, a second resultant R2 may have a rotation angle that is reduced with respect to the rotation angle of the first resultant R1. For example, the attenuator 230 may provide a phase-shifted version of the transmission differential input signal, having a 22.5-degree phase rotation, as shown by the second resultant R2 depicted in FIG. 5C. In other words, in the transmission mode, the phase shifter 200 may generate a differential phase-shifted output signal at the second phase-shifter interface P2 for transmission by the transmitting amplifier 270 and the antenna 122.

With respect to the reception path R, in the reception mode, the attenuator 230 may split and perform amplitude scaling on the reception differential input signal provided by the reception-input balun 250, as discussed above. For example, the attenuator 230 may split the reception differential input signal into a reception in-phase signal I and a reception quadrature signal Q for providing as inputs to a reception-input side (i.e., the transmission-output side) 222 of the coupler 220. The coupler 220 may generate a reception differential output signal at a reception-output side (i.e., the transmission-input side) 221 of the coupler 220, based on the reception in-phase signal I and the reception quadrature signal Q. In the reception mode, the balun 210 may generate a reception single-ended output signal at the single-ended side 212 of the balun 210, based on the reception differential output signal being input to the differential side 214 of the balun 210.

As discussed above, the phase shifter 200 may be a vector-modulator based phase shifter. A vector modulator may use a 90-degree hybrid coupler to generate the in-phase signals I and quadrature signals Q. To provide a 360-degree phase range, the vector modulator may use four phases, including 0 degrees, 90 degrees, 180 degrees, and 270 degrees. The four phases may be achieved either by using a balun followed by a differential coupler or by using two baluns after a single-ended coupler. In some embodiments of the present disclosure, the phase shifter 200 uses the balun 210 followed by a differential coupler, because such a configuration is less sensitive to ground coupling, due to having fewer ground injection points. The vector modulator is an attenuator that amplitude weights the four phases to generate 360-degree phase control at the second phase-shifter interface P2. Due to the bidirectionality of the coupler 220 and the attenuator 230, the phase-shift operation may be performed from the second phase-shifter interface P2 to the first phase-shifter interface P1 as well.

Referring to FIGS. 5A and FIG. 5D, the attenuator 230 may be a pi-based attenuator to enable the phase shifter 200 to shift phases in both transmission and reception directions. For example, the attenuator 230 may include an attenuator first arm 230a and an attenuator second arm 230b. Each attenuator arm of the attenuator 230 may be a pi attenuator having a pi implementation 230z. For example, the attenuator first arm 230a may have nodes 1-4 respectively corresponding to nodes 1-4 of the pi implementation 230z. The attenuator second arm 230b may also have nodes 1-4 respectively corresponding to nodes 1-4 of the pi implementation 230z. Thus, the attenuator first arm 230a and the attenuator second arm 230b may form a pi network. The pi network may allow the phase shifter 200 to maintain a constant impedance value (e.g., 50 ohms) at both interfaces of the attenuator 230. The pi network may also allow the phase shifter 200 to maintain a constant impedance value (e.g., 50 ohms) at both interfaces of the phase shifter 200. For example, the first phase-shifter interface P1 may be 50 ohms single ended, while the second phase-shifter interface P2 may be 50 ohms differential due to the vector summing of the in-phase signals I with the quadrature signals Q. Accordingly, the pi implementation 230z may allow the phase shifter 200 to be bidirectional. In some embodiments, the attenuator 230 may be coupled to transistors (e.g., coupled to transistor-based switches) to enable digital control of the attenuator 230. For example, in some embodiments, the phase shifter 200 may be configured to generate the 360-degree phase range in steps of 22.5 degrees by accepting digital inputs to the transistors coupled the attenuator 230 for digital control. For example, the processing circuit 120 may provide digital inputs for digital control of the phase shifter 200.

In some embodiments, the phase shifter 200 may include shunt inductors (e.g., L1 and L2) to resonate the parasitic capacitance of the attenuator 230. Thus, the parasitic capacitance of the attenuator 230 may be reduced or minimized. In some embodiments, a tunable capacitor 218 (e.g., a capacitor bank) may be connected to the transmission-input side 221 of the coupler 220 (e.g., to a balun-coupler interface) to help tune a response of the phase shifter 200 response across the lower end of the frequency band (e.g., across the lower frequencies of the frequency band). In some embodiments, the differential side 214 of the balun 210 may be connected to a differential-side balun capacitor 216 to provide a ground reference.

FIG. 5E is a schematic diagram depicting coupling between two stages of a transceiver, including the phase shifter depicted in FIG. 5A, according to some embodiments of the present disclosure.

Referring to FIG. 5E, the phase shifter 200 may use a configuration including the balun 210 followed by a differential coupler because such a configuration is less sensitive to ground coupling Cx. As can be seen in FIG. 5E, ground coupling Cx corresponding to the antenna 122 and the transmission-input side 221 of the coupler 220 may be rejected by the differential side 214 of the balun 210 by way of common mode rejection (CMR). Accordingly, the configuration of the phase shifter 200, which uses the balun having a differential side 214, reduces instabilities. Such instabilities might otherwise cause a wireless data link associated with the phase shifter 200 to be lost.

FIG. 6 is a flowchart depicting example operations of a method of transmitting and receiving signals using a phased array, according to some embodiments of the present disclosure. However, the present disclosure is not limited to the sequence or number of the operations of the method 600 shown in FIG. 6, and can be altered into any desired sequence or number of operations as recognized by a person having ordinary skill in the art. For example, in some embodiments, the order may vary, some processes thereof may be performed concurrently or sequentially, or the method 600 may include fewer or additional operations.

Referring to FIG. 6, a method 600 of transmitting and receiving signals using a phased array may include one or more of the following operations. The method 600 may start, and it may be determined whether to perform a reception or a transmission at operation 601. For example, in some embodiments, the processing circuit 120, which is coupled to the phase shifter 200 (e.g., see FIG. 4), may determine whether to perform a reception or a transmission (e.g., at operation 601). Based on determining to perform a transmission at operation 601, a transmission single-ended input signal may be received at operation 602. For example, in some embodiments, the switch 202 corresponding to the phase shifter 200 may be configured for a transmission, and the single-ended side 212 of the balun 210 of the phase shifter 200 may receive the transmission single-ended input signal (e.g., see FIG. 5A) (e.g., at operation 602). The transmission single-ended input signal may correspond to a single-ended signal provided by the mixing and distribution components 160 of the UE 105 for transmission to the network node 110. A transmission differential input signal may be generated based on the transmission single-ended input signal at operation 603. For example, in some embodiments, the balun 210 may generate the transmission differential input signal at the differential side 214 of the balun 210 based on the transmission single-ended input signal being input to the single-ended side 212 of the balun 210 (e.g., at operation 603).

A transmission in-phase signal (e.g., a transmission differential in-phase signal) and a transmission quadrature signal (e.g., a transmission differential quadrature signal) may be generated based on the transmission differential input signal at operation 604. For example, in some embodiments, the coupler 220 may generate the transmission in-phase signal and the transmission differential quadrature signal based on the transmission differential input signal (e.g., at operation 604). The transmission in-phase signal and the transmission quadrature signal may be combined into a differential phase-shifted output signal at operation 605. For example, in some embodiments, the attenuator 230 may combine the transmission in-phase signal and the transmission quadrature signal into a differential phase-shifted output signal (e.g., at operation 605). The differential phase-shifted output signal may be provided for amplification and transmission at operation 606. For example, in some embodiments, the differential phase-shifted output signal may be provided from the attenuator 230 to the transmitting amplifier 270, by way of the switch 202, and amplified and transmitted by the transmitting amplifier 270 as discussed above (e.g., at operation 606), and the method 600 may end.

Referring back to operation 601, based on determining to perform a reception, a reception single-ended input signal may be received at operation 607. The reception single-ended input signal may be a single-ended signal that is transmitted by the network node 110 and received by the UE 105. For example, in some embodiments, the reception single-ended input signal may be received by the UE 105 and provided to the receiving amplifier 240 (e.g., at operation 607) via the antenna 122. A reception differential input signal may be generated based on the reception single-ended input signal at operation 608. For example, in some embodiments, the reception-input balun 250 may generate the reception differential input signal at the differential side 254 of the reception-input balun 250, based on the reception single-ended input signal being input to the single-ended side 252 of the reception-input balun 250 (e.g., at operation 608).

The reception differential input signal may be split into a reception in-phase signal (e.g., a reception differential in-phase signal) and a reception quadrature signal (e.g., a reception differential quadrature signal) at operation 609. For example, in some embodiments, the switch 202 may be configured for a reception, and the attenuator 230 may split the reception differential input signal into the reception in-phase signal and the reception quadrature signal (e.g., at operation 609). A reception differential output signal may be generated based on the reception in-phase signal and the reception quadrature signal at operation 610. For example, in some embodiments, the coupler 220 may generate the reception differential output signal based on the reception in-phase signal and the reception quadrature signal (e.g., at operation 610). A reception single-ended output signal may be generated based on the reception differential output signal at operation 611. For example, in some embodiments, the differential side 214 of the balun 210 may generate the reception single-ended output signal at the single-ended side 212 of the balun 210 based on the reception differential output signal being applied to the differential side 214 of the balun 210 (e.g., at operation 611). The reception single-ended signal may be output at operation 612, and the method 600 may end. For example, in some embodiments, the reception single-ended output signal may be provided from the balun 210 to the mixing and distribution components 160, by way of the switch 202, for further processing by the mixing and distribution components 160 (e.g., at operation 612), and the method 600 may end.

FIG. 7 is a block diagram of an electronic device in a network environment, according to some embodiments of the present disclosure.

Referring to FIG. 7, an electronic device 701 in a network environment 700 may communicate with an electronic device 702 via a first network 798 (e.g., a short-range wireless communication network), or an electronic device 704 or a server 708 via a second network 799 (e.g., a long-range wireless communication network). The electronic device 701 may communicate with the electronic device 704 via the server 708. The electronic device 701 may include a processor 720, a memory 730, an input device 740, a sound output device 755, a display device 760, an audio module 770, a sensor module 776, an interface 777, a haptic module 779, a camera module 780, a power management module 788, a battery 789, a communication module 790, a subscriber identification module (SIM) card 796, or an antenna module 797. In one embodiment, at least one (e.g., the display device 760 or the camera module 780) of the components may be omitted from the electronic device 701, or one or more other components may be added to the electronic device 701. Some of the components may be implemented as a single integrated circuit (IC). For example, the sensor module 776 (e.g., a fingerprint sensor, an iris sensor, or an illuminance sensor) may be embedded in the display device 760 (e.g., a display).

The processor 720 may execute software (e.g., a program 740) to control at least one other component (e.g., a hardware or a software component) of the electronic device 701 coupled to the processor 720 and may perform various data processing or computations.

As at least part of the data processing or computations, the processor 720 may load a command or data received from another component (e.g., the sensor module 776 or the communication module 790) in volatile memory 732, process the command or the data stored in the volatile memory 732, and store resulting data in non-volatile memory 734. The processor 720 may include a main processor 721 (e.g., a central processing unit (CPU) or an application processor (AP)), and an auxiliary processor 723 (e.g., a graphics processing unit (GPU), an image signal processor (ISP), a sensor hub processor, or a communication processor (CP)) that is operable independently from, or in conjunction with, the main processor 721. Additionally or alternatively, the auxiliary processor 723 may be adapted to consume less power than the main processor 721, or execute a particular function. The auxiliary processor 723 may be implemented as being separate from, or a part of, the main processor 721.

The auxiliary processor 723 may control at least some of the functions or states related to at least one component (e.g., the display device 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). The auxiliary processor 723 (e.g., an image signal processor or a communication processor) may be implemented as part of another component (e.g., the camera module 780 or the communication module 790) functionally related to the auxiliary processor 723.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input device 750 may receive a command or data to be used by another component (e.g., the processor 720) of the electronic device 701, from the outside (e.g., a user) of the electronic device 701. The input device 750 may include, for example, a microphone, a mouse, or a keyboard.

The sound output device 755 may output sound signals to the outside of the electronic device 701. The sound output device 755 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 760 may visually provide information to the outside (e.g., a user) of the electronic device 701. The display device 760 may include, for example, a display, a hologram device, or a projector and control circuitry to control a corresponding one of the display, hologram device, and projector. The display device 760 may include touch circuitry adapted to detect a touch, or sensor circuitry (e.g., a pressure sensor) adapted to measure the intensity of force incurred by the touch.

The audio module 770 may convert a sound into an electrical signal and vice versa. The audio module 770 may obtain the sound via the input device 750 or output the sound via the sound output device 755 or a headphone of an external electronic device 702 directly (e.g., wired) or wirelessly coupled to the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. The sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled to the external electronic device 702 directly (e.g., wired) or wirelessly. The interface 777 may include, for example, a high-definition multimedia interface (HDMI), a universal serial bus (USB) interface, a secure digital (SD) card interface, or an audio interface.

A connecting terminal 778 may include a connector via which the electronic device 701 may be physically connected to the external electronic device 702. The connecting terminal 778 may include, for example, an HDMI connector, a USB connector, an SD card connector, or an audio connector (e.g., a headphone connector).

The haptic module 779 may convert an electrical signal into a mechanical stimulus (e.g., a vibration or a movement) or an electrical stimulus which may be recognized by a user via tactile sensation or kinesthetic sensation. The haptic module 779 may include, for example, a motor, a piezoelectric element, or an electrical stimulator.

The camera module 780 may capture a still image or moving images. The camera module 780 may include one or more lenses, image sensors, image signal processors, or flashes. The power management module 788 may manage power supplied to the electronic device 701. The power management module 788 may be implemented as at least part of, for example, a power management integrated circuit (PMIC).

The battery 789 may supply power to at least one component of the electronic device 701. The battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the AP) and supports a direct (e.g., wired) communication or a wireless communication. The communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as BLUETOOTH™, wireless-fidelity (Wi-Fi) direct, or a standard of the Infrared Data Association (IrDA)) or the second network 799 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The antenna module 797 may transmit or receive a signal or power to or from the outside (e.g., the external electronic device) of the electronic device 701. The antenna module 797 may include one or more antennas, and, therefrom, at least one antenna appropriate for a communication scheme used in the communication network, such as the first network 798 or the second network 799, may be selected, for example, by the communication module 790 (e.g., the wireless communication module 792). The signal or the power may then be transmitted or received between the communication module 790 and the external electronic device via the selected at least one antenna.

Commands or data may be transmitted or received between the electronic device 701 and the external electronic device 704 via the server 708 coupled to the second network 799. Each of the electronic devices 702 and 704 may be a device of a same type as, or a different type, from the electronic device 701. All or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 701. The electronic device 701 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method of transmitting and receiving signals in a phased array, the method comprising:
   receiving, by a balun of a phase shifter, a transmission single-ended input signal at a single-ended side of the balun and generating a transmission differential input signal at a differential side of the balun;
   generating, by a differential quadrature coupler of the phase shifter, a transmission in-phase signal and a transmission quadrature signal, based on the transmission differential input signal; and
   combining, by a differential attenuator of the phase shifter, the transmission in-phase signal and the transmission quadrature signal into a differential phase-shifted output signal, the differential attenuator being connected to a transmission-output side of the differential quadrature coupler.

2. The method of claim 1, wherein the phase shifter is shared between transmission and reception paths.

3. The method of claim 1, further comprising:
   causing, by a processor communicably coupled to the phase shifter, a switch of the phase shifter to be configured for a transmission; and
   providing the differential phase-shifted output signal to a transmitting amplifier to be transmitted.

4. The method of claim 1, further comprising:
   causing, by a processor communicably coupled to the phase shifter, a switch to be configured for a reception;
   splitting, by the differential attenuator, a reception differential input signal into a reception in-phase signal and a reception quadrature signal;
   generating, by the differential quadrature coupler, a reception differential output signal, based on the reception in-phase signal and the reception quadrature signal; and
   generating, by the balun, a reception single-ended output signal at the single-ended side of the balun, based on the reception differential output signal being input to the differential side of the balun.

5. The method of claim 1, wherein the balun is connected to a transmission-input side of the differential quadrature coupler.

6. The method of claim 1, wherein:
   the differential attenuator is configured to be digitally controlled; and
   the phase shifter is configured to generate a 360-degree phase range in steps of 22.5 degrees.

7. The method of claim 1, wherein:
   the differential quadrature coupler is a 90-degree hybrid coupler; and
   the differential attenuator comprises a pi implementation.

8. The method of claim 1, wherein:
   a first phase-shifter interface corresponding to a transmission-input side of the differential quadrature coupler has a single-ended impedance that is equal to a first value; and
   a second phase-shifter interface corresponding to a transmission-output side of the differential quadrature coupler has a differential impedance that is substantially equal to the first value.

9. A phase shifter for transmitting and receiving signals in a phased array, the phase shifter comprising:
   a balun;
   a differential quadrature coupler; and
   a differential attenuator,
   wherein the phase shifter is configured to:
      receive a transmission single-ended input signal at a single-ended side of the balun and generate a transmission differential input signal at a differential side of the balun;
      generate, by the differential quadrature coupler, a transmission in-phase signal and a transmission quadrature signal, based on the transmission differential input signal; and
      combine, by the differential attenuator, the transmission in-phase signal and the transmission quadrature signal into a differential phase-shifted output signal, the differential attenuator being connected to a transmission-output side of the differential quadrature coupler.

10. The phase shifter of claim 9, wherein the phase shifter is shared between transmission and reception paths.

11. The phase shifter of claim 9, configured to:
    transmit based on a processor communicably coupled to the phase shifter causing a switch of the phase shifter to be configured for a transmission; and
    provide the differential phase-shifted output signal to a transmitting amplifier to be transmitted.

12. The phase shifter of claim 9, configured to:
    transmit based on a processor communicably coupled to the phase shifter causing a switch of the phase shifter to be configured for a reception;
    split, by the differential attenuator, a reception differential input signal into a reception in-phase signal and a reception quadrature signal;
    generate, by the differential quadrature coupler, a reception differential output signal, based on the reception in-phase signal and the reception quadrature signal; and
    generate, by the balun, a reception single-ended output signal at the single-ended side of the balun, based on the reception differential output signal being input to the differential side of the balun.

13. The phase shifter of claim 9, wherein the balun is connected to a transmission-input side of the differential quadrature coupler.

14. The phase shifter of claim 9, wherein:
    the differential attenuator is configured to be digitally controlled; and
    the phase shifter is configured to generate a 360-degree phase range in steps of 22.5 degrees.

15. The phase shifter of claim 9, wherein:
    the differential quadrature coupler is a 90-degree hybrid coupler; and
    the differential attenuator comprises a pi implementation.

16. The phase shifter of claim 9, wherein:
    a first phase-shifter interface corresponding to a transmission-input side of the differential quadrature coupler has a single-ended impedance that is equal to a first value; and
    a second phase-shifter interface corresponding to a transmission-output side of the differential quadrature coupler has a differential impedance that is substantially equal to the first value.

17. A user equipment (UE) comprising a phase shifter, wherein the phase shifter is configured to:

receive a transmission single-ended input signal at a single-ended side of a balun and generate a transmission differential input signal at a differential side of the balun;

generate, by a differential quadrature coupler, a transmission in-phase signal and a transmission quadrature signal, based on the transmission differential input signal; and combine, by a differential attenuator, the transmission in-phase signal and the transmission quadrature signal into a differential phase-shifted output signal, the differential attenuator being connected to a transmission-output side of the differential quadrature coupler.

18. The UE of claim 17, wherein the phase shifter is shared between transmission and reception paths.

19. The UE of claim 17, wherein the phase shifter is configured to:

transmit based on a processor communicably coupled to the phase shifter causing a switch of the phase shifter to be configured for a transmission; and provide the differential phase-shifted output signal to a transmitting amplifier to be transmitted.

20. The UE of claim 17, wherein the phase shifter is configured to:

transmit based on a processor communicably coupled to the phase shifter causing a switch of the phase shifter to be configured for a reception;

split, by the differential attenuator, a reception differential input signal into a reception in-phase signal and a reception quadrature signal;

generate, by the differential quadrature coupler, a reception differential output signal, based on the reception in-phase signal and the reception quadrature signal; and generate, by the balun, a reception single-ended output signal at the single-ended side of the balun, based on the reception differential output signal being input to the differential side of the balun.

* * * * *